United States Patent [19]

Keefe et al.

[11] 4,263,662
[45] Apr. 21, 1981

[54] GUARD RAIL FOR CONTIGUOUS ELEMENT BUBBLE CHIPS

[75] Inventors: George E. Keefe, Montrose; Emerson W. Pugh, Mount Kisco, both of N.Y.

[73] Assignee: International Business Machines Corporation, Armonk, N.Y.

[21] Appl. No.: 107,993

[22] Filed: Dec. 28, 1979

[51] Int. Cl.$^3$ .............................................. G11C 19/08
[52] U.S. Cl. ......................................... 365/36; 365/39
[58] Field of Search ...................................... 365/36, 39

[56] References Cited

U.S. PATENT DOCUMENTS

| 3,508,222 | 4/1970 | Bobeck et al. | 365/7 |
| 3,729,726 | 4/1973 | Bobeok | 365/43 |

OTHER PUBLICATIONS

IBM Technical Disclosure Bulletin-vol. 19, No. 7, Dec. 1976, pp. 2741-2743.

Primary Examiner—James W. Moffitt
Attorney, Agent, or Firm—Jackson E. Stanland

[57] ABSTRACT

Guard rails are described for particular use with magnetic bubble domain chips using contiguous propagation elements. These guard rails generally surround the active device area (storage area) of the chip and are used to move stray bubble domains from the storage area to the edge of the chip, or to a collapser etc., and also to prevent stray bubbles from entering the active device area. These guard rail structures are comprised of contiguous propagation elements characterized by an undulating edge and a smooth edge, both of which generally move bubble domains away from the active device area in response to the reorientation of the same magnetic drive field. In one embodiment, the guard rail is a spiral structure surrounding the active device area, having one end in the interior of the magnetic bubble chip adjacent to the active device area, and another end near the edge of the chip, or near a bubble annihilator, etc. In another embodiment, the guard rail is comprised of a plurality of structures generally defining a broken-spiral which surround the active device area. One end of each of structure is located near the active device area, while the other end is disposed toward the edge of the magnetic bubble chip.

9 Claims, 3 Drawing Figures

GUARD RAIL FOR CONTIGUOUS ELEMENT BUBBLE CHIPS

DESCRIPTION

Technical Field

This invention relates to magnetic bubble domain chips using contiguous propagation elements, and more particularly to such a magnetic bubble domain chip having a guard rail associated therewith formed of contiguous propagation elements.

BACKGROUND ART

Magnetic bubble domain chips are well known in the art and are used for non volatile storage of information represented by the magnetic bubble domains. In such chips, the storage area is typically surrounded by a guard rail which serves two purposes: (1) it prevents stray magnetic bubbles from entering the storage area of the chip and (2) it collects stray bubbles from inside the storage area when they come into contact with the guard rail, in order to ensure that these bubble domains are moved away from the storage area. In this manner, the guard rail prevents bubbles outside the storage area from moving to the storage devices themselves, and eliminates bubble domains which may stray from the storage devices and which might wander about the storage area.

In the prior art, guard rails are known which are comprised of discrete magnetic propagation elements forming propagation paths along which bubble domains move. An example of such a guard rail is one comprised of permalloy T and I bars or chevron elements, such as that shown in U. S. Pat. Nos. 3,810,132 and 3,868,661. Since the propagation elements are discrete from one another, stray bubble domains can contact the guard rail from either side of it and will be propagated in a single, desired direction. However, for contiguous propagation element devices, guard rails are not easily provided.

Since contiguous propagation element patterns move bubble domains in one direction on one side of the pattern and in the opposite direction on the other side of the pattern, for the same magnetic field reorientation sequence, it is easy to prevent stray bubble domains from entering the storage area. For example, an ion implanted strip encircling the storage area of the bubble chip would prevent bubble domains from passing into the storage area, since bubble domains cannot move easily through a non′ion implanted region. However, such an encircling border would also prevent stray bubble domains from leaving the general storage area of the chip and therefore the second purpose of the guard rail would not be achieved.

While it is conceptually possible to use a guard rail comprised of discrete propagation elements (e.g., conventional T-bar or chevron elements) in combination with an active storage area comprising contiguous propagation elements, such a design is not advisable since additional processing steps would be required. That is, the entire bubble chip could not be fabricated in a single masking step, but would require an additional masking step and an additional alignment procedure.

Accordingly, it is a primary object of this invention to provide a magnetic bubble domain chip having a guard rail suitable for use with contiguous element bubble propagation devices.

It is another object of this invention to provide a bubble domain chip using contiguous propagation elements and having a guard rail thereon which can be fabricated in the same masking step as that used to make the other devices on the bubble chip.

It is still another object of the present invention to provide a guard rail for a bubble domain chip using contiguous element structures, where the guard rail structure can be used to provide current carrying functions in addition to preventing adverse effects due to stray magnetic bubble domains in the magnetic bubble chip.

It is another object of the present invention to provide a magnetic bubble domain chip having contiguous propagation element structures and a guard rail comprised of contiguous elements, where both sides of the guardrail tend to move bubble domains in the same direction for the same sense of reorientation of the magnetic drive field.

DISCLOSURE OF THE INVENTION

A guard rail is provided for magnetic bubble domain chips using contiguous propagation elements. The guard rail is also comprised of contiguous propagation elements, and can therefore be fabricated in the same masking step(s) used to provide the rest of the bubble domain chip.

The guard rail has a generally spiral shape, surrounding the active device area of the chip (such as the storage area) and extending outward from the active device area toward the edges of the bubble chip. In one embodiment, the guard rail is comprised of a single spiral shift register which surrounds the storage area of the chip and ends at a location near the edge of the chip (i.e., a location removed from the storage area). In another embodiment, the guard rail is comprised of "broken-spirals" of contiguous propagation elements forming small shift registers which are separate from one another and located around the storage area of the chip. These small broken-spiral registers extend from the region of the storage area of the chip toward the edges of the chip. In another embodiment, the guard rail is fabricated by ion implantation to form contiguous propagation elements, and the metal used as an ion implantation mask also functions as a control conductor for the active devices on the bubble chip.

In all of these embodiments, the guard rail is comprised of contiguous propagation elements, where one side of the guard rail has a generally undulating edge while the other side has a smooth edge. The undulating edge is an edge along which magnetic charged walls or pole patterns are formed for moving the bubble domains in the normal manner, and can be comprised of circular regions having cups therebetween, or diamond shaped regions having cups therebetween. Both of these shapes are well known in the art and are mentioned for purposes of example only. The smooth edge of the guard rail can be either a straight edge or a curved edge where the curvature is such as to produce an "annular-type" structure. That is, the center(s) of curvature for both the curved edge and the undulating edge are on the same side of the guard rail. Since it is smooth, magnetic charged walls which form along that edge will also move so as to push bubbles away from the storage areas. At high frequencies, bubbles will not be propagated in the usual sense on the smooth edge of the guard rail, since they will not be able to keep up with the rapid motion of the charged walls. However, their general direction of motion will be toward the edge of the chip.

These contiguous propagation element guard rails can be adapted to different types of magnetic bubble domain chips. For example, these concepts can be used whether the contiguous propagation element storage devices are comprised of ion implanted structures, permalloy structures, etc. In each case, the guard rail is comprised of the same material as the storage structure and is fabricated in the same masking step.

These and other objects, features, and advantages will be apparent from the following more particular description of the preferred embodiments.

BEST MODE FOR CARRYING OUT THE INVENTION

Figure 1:
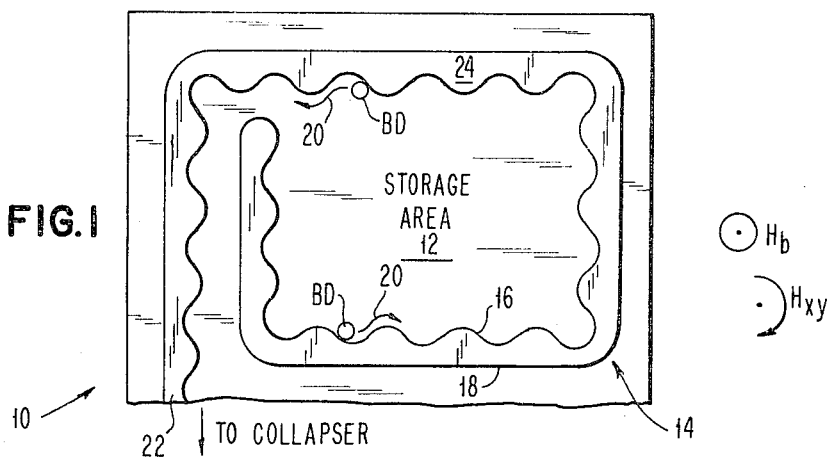
FIG. 1 illustrates a spiral guard rail surrounding a storage area in a magnetic bubble domain chip, the guard rail being comprised of contiguous propagation elements having an undulating edge and a generally smooth edge.

FIG. 1 is a schematic illustration of a magnetic bubble domain chip 10 having a storage area 12 in which active devices are located. These "active devices" include storage devices, such as shift registers along which magnetic bubble domains travel as a magnetic field $H_{xy}$ reorients in the plane of chip 10. A bias field $H_b$ normal to the plane of chip 10 stabilizes the diameter of bubble domains in area 12. In the practice of the invention, the active device area is one in which contiguous propagation elements are used to move the bubble domains. This type of propagation element is well known in the bubble domain art, and reference is made to U.S. Pat. Nos. 4,128,895, 4,142,250, 4,164,026, and 4,164,029, which show magnetic bubble domain chips having contiguous propagation elements for movement of the bubble domains.

In the magnetic bubble domain art, it is preferable to provide a guard rail to prevent stray bubbles from entering storage area 12, and to remove stray bubbles from the storage area once they come into contact with the guard rail. In FIG. 1, a spiral shaped guard rail 14 surrounds storage area 12. Guard rail 14 is a shift register which has an inner undulating edge 16 and an outer smooth edge 18. Bubble domains BD propagate along the edge 16 of the guard rail in the direction of arrows 20, as field $H_{xy}$ reorients.

As is apparent, stray bubbles from the storage area that contact the guard rail will move along the inner edge 16 thereof and be removed from the storage area. The far end 22 of the guard rail can terminate at the edge of magnetic chip 10, or can bring bubble domains BD to an area of the chip where they are collected or collapsed. For example, if the bubble domains are brought to the edge of the chip they will either stick there or be collapsed. If they are brought to a magnetically soft disk, they can be collected for later annihilation, or a current carrying line can be used to collapse them.

The undulating edge 16 of the guard rail can be comprised of generally circular or diamond shaped regions having convex and concave portions. Of course, other geometries are also suitable and can be similar to the geometries used for the contiguous propagation elements located in the storage area 12.

If the contiguous propagation elements are produced by ion implantation, the storage area 12 will be formed of ion implanted propagation elements, and the regions of the magnetic chip adjacent to the inside edge 16 and outside edge 18 of the guard rail will also be ion implanted. The shaded region 24 is not ion implanted and is typically comprised of an ion implantation mask. An example of such a mask is a layer of a metal, such as gold, which is of sufficient thickness that the ions to be implanted cannot pass through the gold to the underlying magnetic chip.

During operation of the magnetic chip of FIG. 1, stray bubble domains which contact the inner edge 16 of the guard rail will move in a direction to bring them away from storage area 12. Additionally, bubble domains located outside the guard rail will not be able to easily pass beneath the non ion implanted portions of the magnetic chip. In this manner, they will be prevented from entering the storage area.

The contiguous propagation elements forming the storage area 12 and the guard rail 14 can be comprised of magnetically soft material, such as permalloy. An example of such propagation elements is found in copending application Ser. No. 58,718 (YO979-020), filed July 18, 1979, in the name of M. Cohen and assigned to the present assignee. If such propagation elements are used, an ion implanted strip along the interior length of the guard rail will prevent bubble domains in the outer edges of the chip from passing under the guard rail to enter storage area 12.

Figure 2:
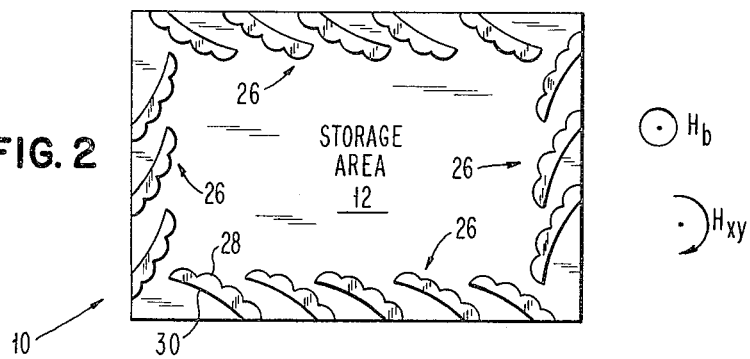
FIG. 2 is a schematic illustration of a magnetic bubble domain chip, having a guard rail comprised of a plurality of "broken-spiral" propagation patterns.

In FIG. 2, the guard rail is comprised of a plurality of "broken-spiral" structures 26. Structures 26 are comprised of contiguous propagation elements in the manner of those of the guard rail 14 shown in FIG. 1. However, each of these structures 26 forms a small shift register to collect stray bubble domains in order to remove them from storage area 12, or to prevent them from entering the storage area.

Structures 26 are comprised of an undulating propagation edge 28 along which bubble domains move as the magnetic field $H_{xy}$ reorients in the plane of magnetic chip 10, and a smooth edge 30. Additionally, smooth edge 30 is curved (with the same sense of curvature as that of the undulating edge 28, i.e., to form a portion of an "annular-type" structure) so that magnetic charged walls which form along edge 30 will also move so as to push bubble domains out of the storage area. At high frequencies of the field $H_{xy}$, bubbles will not be propagated along edge 30 in the usual sense, since they will not be able to keep up with the rapid motion of the magnetic charged walls. However, their general direction of motion will be toward the edges of magnetic chip 10, i.e., away from storage area 12.

Structures 26 are fabricated in the same manner as the guard rail of FIG. 1. That is, either ion implanted contiguous propagation elements can be used, or magnetically soft layers can be used to provide the guard rail propagation structures.

Figure 3:
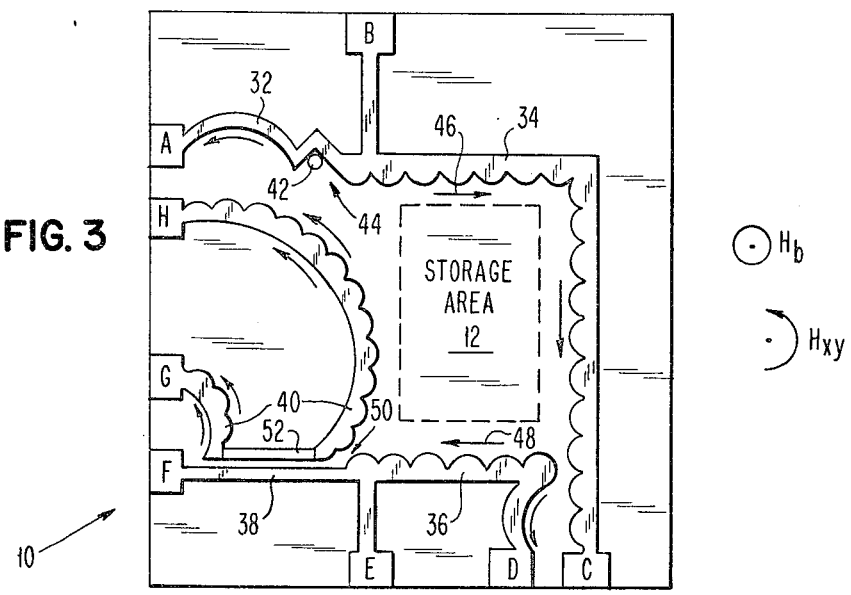
FIG. 3 is an illustration of a magnetic bubble domain chip wherein the guard rail is comprised of ion implanted regions located around a metallic masking layer, where the masking layer also functions as a current carrying conductor for the active devices on the bubble domain chip.

FIG. 3 schematically illustrates an extension of the concept of FIG. 2, in which a metallic layer used as an ion implantation mask in the formation of the guard rail also functions as a current carrying conductor for various purposes, such as bubble domain transfer, stretching, nucleation, and sensing. As with FIGS. 1 and 2, the magnetic chip is designated 10 and the storage area within the chip is designated 12.

The guard rail in FIG. 3 is comprised of ion implanted structures generally surrounding storage area 12. An ion implantation mask, such as a gold layer, is used to protect portions of magnetic chip 10 from ion implantation. This masking layer is comprised of a first portion 32, extending between electrical contact pads A and B, a portion 34 extending between electrical contact pads B and C, a portion 36 extending between electrical contact pads D and E, a portion 38 extending between electrical contact pads E and F, and a portion 40 extending between electrical contact pads F and G. Current passed through the various portions 32-40 is used to accommodate certain functions in magnetic chip 10. The arrows in FIG. 3 indicate the direction of bubble domain motion for a counterclockwise reorienting magnetic drive field $H_{xy}$.

Current carrying conductor portion 32 is used as a bubble domain nucleator. By passing a current through this conductor portion bubble domain 42 will be formed in a cusp 44 of the nucleator formed by mask portion 32. This bubble domain will travel in the direction of arrow 46 along the ion implanted portion of magnetic chip 10 defined by mask portion 34. Conductor portion 34 functions to achieve the transfer of bubble domains into storage area 12 when an electrical current passes between contact pads B and C.

Bubble domains in storage area 12 can be removed therefrom by a current in conductor portion 36. This electrical current passes between contact pads D and E. Bubble domains moving along the edge of the ion implanted region defined by mask 36 move in the direction of arrow 48.

Conductor portion 38 is used as a bubble domain stretcher. A current in portion 38 between contact pads E and F causes a bubble domain located at cusp 50 to be stretched along the length of conductor 38. A bubble stretched along conductor 38 will be sensed by a sensing element 52 which is contacted by conductor portion 40. Element 52 is, for example, comprised of a magnetoresistive material such as permalloy. When the bubble is stretched adjacent to sensing element 52, its stray magnetic field will be coupled to the sensing element and a voltage will be developed across the sensing element. When sensing of the bubble is to occur, a current is passed between contact pads G and H, as is well known in the art.

In FIG. 3, ion implanted regions are formed in magnetic chip 10, on the inside and outside edges of the conductor portions 32-40. The inner edge ion implanted regions have a generally undulating geometry, while the ion implanted regions along the outer edge of electrical portions 32-40 are smooth. These ion implanted regions surrounding electrical conductors 32-40 function as guard rail elements in the same manner as the ion implanted regions did along the broken-spiral structures 26 of FIG. 2. That is, magnetic charged walls along either the inside or outside edges of the guard rail collect bubble domains and move them in a direction away from storage area 12. This movement of the bubble domains along the edges of the guard rail is indicated by the arrows in FIG. 3. Although some arrows have been given a numerical designation to aid in the description of the magnetic chip of FIG. 3, even those arrows which are unnumbered designate the movement of bubble domains along the associated edge of the guard rail structure.

The sense of curvature of the guard rails defined by conductors 32, 36, and 40 ensure that magnetic charged walls formed therealong propagate in a direction to prevent stray bubbles from entering storage area 12 along the chip portions between pads A-H, C-D, and F-G. This is especially important in the portion between pads A-H, where it is necessary to prevent stray bubbles from getting past the nucleator and then carried along in the direction of arrow 46.

In this invention, a guard rail structure has been described which is easy to fabricate using the same fabrication steps used to provide the contiguous disk devices of the storage area of the chip. Additionally, the guard rail is unique in that both sides of it tend to push bubble domains in the same general direction for the same sense of reorientation in magnetic drive field. This is in contrast with generally used contiguous disk structures, where both sides of the contiguous disk pattern are used to move bubble domains and have undulating edges, and wherein bubble domain motions on opposite sides of the propagation pattern are in opposite directions.

We claim:

1. A magnetic bubble domain chip, comprising:
   a magnetic medium in which bubble domains can be moved by a propagation means including patterns of contiguous propagation elements and a reorienting magnetic field substantially in the plane of said patterns,
   a storage area in the interior of said magnetic bubble domain chip, said storage area including patterns of contiguous propagation elements for storing bubble domains in positions defined by said contiguous propagation elements,
   guard rail means generally surrounding said storage area for collecting stray bubble domains from said storage area and for preventing entry into said storage area of stray bubble domains from outside said guard rail said guard rail including a generally spiral shaped pattern of contiguous propagation elements beginning at a location near said storage area and spiralling outwardly toward an edge of said chip, the side of said guard rail nearer to said storage area having a generally undulating edge forming concave and convex portions, the side of said guard rail remote from said storage area being smooth, said guard rail forming a shift register along which said stray bubble domains move in response to the reorientation of said magnetic field, the general direction of movement therealong being away from said storage area.

2. The chip of claim 1, where the side of said guard rail remote from said storage area is curved.

3. The chip of claim 1, where said contiguous propagation elements in said storage area and in said guard rail are comprised of the same material and are formed in the same masking step.

4. The chip of claim 1, where said contiguous propagation elements in said storage area and in said guard rail are comprised of ion implanted regions of a magnetic layer.

5. The chip of claim 1, where said guard rail is comprised of a plurality of discrete propagation patterns located around said storage area, each discrete pattern being generally disposed with one end close to said storage area and the other end toward an edge of said chip, each said discrete pattern having an undulating edge and a smooth edge, where said smooth edge is curved.

6. The chip of claim 5, where said guard rail is comprised of ion implanted elements formed by ion implantations through a mask comprised of an electrically conductive material, portions of said mask being electrically connected to a current source.

7. A magnetic bubble domain chip, comprising:

A magnetic bubble domain medium in which said bubble domains can be propagated and a magnetic layer having ion implanted regions therein along which said bubble domains move in response to the reorientation of a magnetic field substantially in the plane of said magnetic layer, a storage area of said magnetic medium in which bubble domains representing bits of information are stored and are propagated by ion implanted contiguous propagation elements formed in said magnetic layer adjacent to said storage area, said storage area being located in an interior portion of said magnetic medium remote from the edges of said magentic medium, a guard rail structure for preventing stray bubble domains from leaving said storage area or from entering said storage area from locations remote from said storage area, said guard rail being comprised of a plurality of elongated shift registers generally surrounding said storage area, each said elongated shift register being comprised of ion implanted, contiguous propagation elements, and having one side defining an undulating path for movement of bubble domains while the other side defines a generally smooth path without substantial undulations therealong, the movement of bubble domains along each side of said elongated shift register being in a direction generally away from said storage area.

8. The chip of claim 7, further including a layer of electrically conductive material forming a mask for ion implantation of said magnetic layer to define said elongated shift registers, portions of said mask being connected to electrical current sources for conducting electrical currents therethrough.

9. The chip of claim 7, where portions of said smooth side of said guard rail are curved with the same sense of curvature as the opposing sides of said portions of guard rail.

* * * * *